United States Patent
Krasnov (10) Patent No.: US 9,202,958 B2
(45) Date of Patent: Dec. 1, 2015

(54) PHOTOVOLTAIC SYSTEMS AND ASSOCIATED COMPONENTS THAT ARE USED ON BUILDINGS AND/OR ASSOCIATED METHODS

(75) Inventor: Alexey Krasnov, Canton, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 1051 days.

(21) Appl. No.: 13/288,520

(22) Filed: Nov. 3, 2011

(65) Prior Publication Data

US 2013/0112245 A1    May 9, 2013

(51) Int. Cl.
*H01L 31/048* (2014.01)
*H01L 31/054* (2014.01)
*H02S 20/26* (2014.01)

(52) U.S. Cl.
CPC ............ *H01L 31/0543* (2014.12); *H02S 20/26* (2014.12); *Y02B 10/12* (2013.01); *Y02E 10/52* (2013.01); *Y10T 29/49355* (2015.01)

(58) Field of Classification Search
CPC .................................................. H01L 31/0543
USPC ......................................................... 136/251
See application file for complete search history.

(56) References Cited

U.S. PATENT DOCUMENTS

| | | | |
|---|---|---|---|
| 4,364,766 A | 12/1982 | Nitschke | |
| 5,030,594 A | 7/1991 | Heithoff | |
| 5,221,363 A * | 6/1993 | Gillard | 136/248 |
| 5,228,925 A * | 7/1993 | Nath et al. | 136/251 |
| 5,383,990 A | 1/1995 | Tsuji | |
| 5,443,669 A | 8/1995 | Tiinker | |
| 6,009,726 A | 1/2000 | Funk | |
| 6,123,824 A | 9/2000 | Sano et al. | |
| 6,158,247 A | 12/2000 | Didelot | |
| 6,240,746 B1 | 6/2001 | Maeda et al. | |
| 6,288,325 B1 | 9/2001 | Jansen et al. | |
| 6,318,125 B1 | 11/2001 | Diederen et al. | |
| 6,321,570 B1 | 11/2001 | De Vries, Jr. et al. | |
| 6,613,603 B1 | 9/2003 | Sano | |
| 6,688,053 B2 * | 2/2004 | Winarski | 52/173.3 |
| 6,784,361 B2 | 8/2004 | Carlson et al. | |
| 6,983,104 B2 | 1/2006 | Longobardo et al. | |
| 7,082,260 B2 | 7/2006 | Longobardo et al. | |

(Continued)

FOREIGN PATENT DOCUMENTS

DE   199 07 506 A1   9/1999
EP   2 328 185         6/2011

(Continued)

OTHER PUBLICATIONS

U.S. Appl. No. 12/923,838, filed Oct. 8, 2010, Broadway et al.

(Continued)

*Primary Examiner* — Golam Mowla
(74) *Attorney, Agent, or Firm* — Nixon & Vanderhye P.C.

(57) ABSTRACT

Certain example embodiments relate to building integrated photovoltaic (BIPV) or building adapted photovoltaic (BAPV) systems and components thereof. In certain example embodiments a component includes an asymmetric glass substrate that includes at least first, second, and third surfaces. The third surface can be laminated to a photovoltaic subassembly. The first surface can structured to be angled away from a vertical plane of a building at an angle of between 5 and 40 degrees. The first surface may be longer than the second surface.

12 Claims, 3 Drawing Sheets

(56) References Cited

U.S. PATENT DOCUMENTS

| | | |
|---|---|---|
| 7,140,204 B2 | 11/2006 | Vandal |
| 7,557,053 B2 | 7/2009 | Thomsen et al. |
| 7,700,870 B2 | 4/2010 | Thomsen et al. |
| 2004/0261841 A1 | 12/2004 | Negami et al. |
| 2006/0169316 A1 | 8/2006 | Thomsen et al. |
| 2006/0180200 A1 | 8/2006 | Platzer Bjorkman et al. |
| 2006/0249199 A1 | 11/2006 | Thomsen et al. |
| 2007/0215205 A1 | 9/2007 | Thomsen et al. |
| 2007/0227582 A1 | 10/2007 | Chen et al. |
| 2008/0289689 A1 | 11/2008 | Gibson |
| 2008/0308147 A1 | 12/2008 | Lu et al. |
| 2009/0217978 A1 | 9/2009 | Thomsen et al. |
| 2009/0223252 A1 | 9/2009 | Fulton et al. |
| 2009/0255568 A1 * | 10/2009 | Morgan ................. 136/246 |
| 2010/0122728 A1 | 5/2010 | Fulton et al. |
| 2010/0255980 A1 | 10/2010 | Fulton et al. |
| 2011/0157703 A1 | 6/2011 | Broadway et al. |
| 2013/0306138 A1 | 11/2013 | Freedman et al. |

FOREIGN PATENT DOCUMENTS

| | | |
|---|---|---|
| WO | 2008/072224 A2 | 6/2008 |
| WO | WO 2009/121180 | 10/2009 |
| WO | 2010/055507 A2 | 5/2010 |
| WO | 2010/055508 A2 | 5/2010 |
| WO | 2010/076796 A2 | 7/2010 |
| WO | 2011/042904 A2 | 4/2011 |
| WO | 2011/048595 A2 | 4/2011 |
| WO | WO 2012/095847 A1 | 7/2012 |
| WO | WO 2013/038409 A2 | 3/2013 |

OTHER PUBLICATIONS

U.S. Appl. No. 12/929,481, filed Jan. 27, 2011, Broadway et a.

* cited by examiner

PHOTOVOLTAIC SYSTEMS AND ASSOCIATED COMPONENTS THAT ARE USED ON BUILDINGS AND/OR ASSOCIATED METHODS

FIELD OF THE INVENTION

Certain example embodiments herein relate to photovoltaic systems that are integrated and/or installed onto buildings and/or methods of making the same. More particularly, certain example embodiments relate to asymmetrically patterned glass or other transparent substrates that are used in photovoltaic systems for buildings.

BACKGROUND AND SUMMARY OF EXAMPLE EMBODIMENTS OF THE INVENTION

The energy needs of society are constantly growing. Techniques to meet this growing energy demand are continually sought after. One area of focus has been in the area of solar power. Solar power technology can take various forms. For instance, various types of photovoltaic devices are known in the art (e.g., see U.S. Patent Document Nos. 2004/0261841, 2006/0180200, 2008/0308147; U.S. Pat. Nos. 6,784,361, 6,288,325, 6,613,603, and 6,123,824, the disclosures of which are each hereby incorporated by reference).

In certain instances, photovoltaic (PV) devices are installed as part of a solar farm, onto the roof of a residential building, or the like. These devices may sometimes also include a tracking system that operates to continually adjust the positioning of the device such that direct sunlight approaches the PV device from a direction that is perpendicular to the surface of the PV device. While this technique may improve the overall efficiency of PV systems, the additional cost and parts required for maintaining such a tracking system may increase costs in other ways.

One issue with solar power is that it may require a large land footprint. As land can be expensive and/or limited (e.g., in urban and suburban contexts), this can also raise the cost of solar powered systems and/or otherwise restrict their feasibility.

One way to address this land requirement is to install a PV system as part of an existing structure, such as a building or dwelling. Such an arrangement may be beneficial in that buildings can have large vertical footprints, especially skyscrapers and larger buildings, while having a relatively small land footprint. Further, the sides (and top) of these buildings may have significant exposure to direct or indirect sunlight.

One technique for making use of the vertical space occupied by these building is to install PV devices on or as a part of the building structure. Such PV systems are conventionally referred to as building-integrated photovoltaic (BIPV) systems or building-applied photovoltaic (BAPV) systems. Such systems can (but not always) replace or augment conventional building materials that are used as part of the building. For example, a shingle on a house or a window on an office building can sometimes be replaced with a device and achieve the same or similar functionality to a regular shingle or window, but also provide for collection of solar power from an associated PV device.

Figure 7:
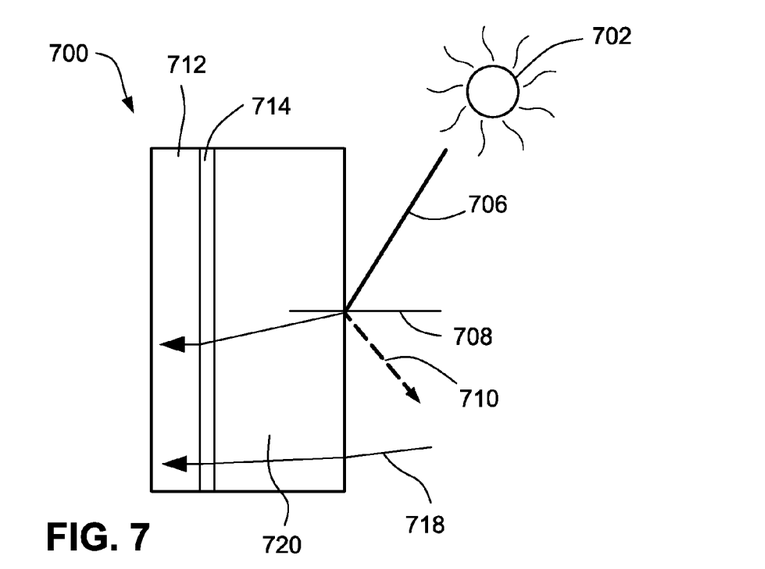
FIG. 7 is a cross-sectional view a conventional BIPV system.

FIG. 7 shows a conventional BIPV device 700 that comprises a stack of semiconductor layers 712 or a semiconductor wafer that is laminated to a glass substrate 720 via a laminate layer 714. Such a system 700 may collect at least some direct sunlight 706 and/or at least some diffuse light 718. However, as BIPV systems typically do not track the sun (e.g., as with some solar power installations) because the walls and/or roofs cannot move, the energy conversion efficiency may depend on the relative position of the sun.

Thus, the typical flat and vertical installation BIPV system shown in FIG. 7 may have high light reflection 710 when the sun is located at a shallow angle to the surface of the glass substrate. The surface of the glass substrate 720 has a normal vector 708 that may represent an "optimum" angle from which reflection of solar energy is reduced. Thus, when energy is arriving at a shallow angle, the angle to the surface normal is increased. To complicate matters further, the time of day when the sun may provide the most energy is when it is also at the highest point in the sky (e.g., solar noon). During this high point, the angle of incidence to the plane of the glass of the BIPV system may be near or at its shallowest point. Thus, while this point may be when the energy hitting the surface of the glass substrate 720 is at its highest, the reflection percentage may also be at its highest. This can cause reduced operating efficiency of the installed BIPV system (e.g., because more light is reflected due to the low angle).

Accordingly, it will be appreciated that it would be desirable to provide new and improved techniques for developing, producing, manufacturing, PV systems for building adapted or building integrated systems.

In certain example embodiments, a BIPV/BAPV system increases the amount of light (energy) being "harvested" by reducing the amount of light reflected from the glass substrate that fronts the semiconductor layer of an exemplary BIPV/BAPV system.

In certain example embodiments, a patterned glass (e.g., patterned float glass) substrate is coupled with a semiconductor layer. This patterned glass element may be asymmetric in nature and provide reduced light reflection when the sun is at a high point (e.g., because a surface normal from a surface of the asymmetric pattern is closer to a vector that represents direct sunlight.

In certain example embodiments, a photovoltaic system may be used in a BIPV or BAPV assembly.

In certain example embodiments, there is provided a component adapted for use with a building integrated photovoltaic (BIPV) or a building adapted photovoltaic (BAPV) system. An asymmetric glass substrate includes first, second, and third surfaces when viewed in cross section, with the asymmetric glass substrate being substantially triangular shaped in cross section such that the third surface is longer than the first and second surfaces. The third surface is adapted to be laminated to a photovoltaic device. The first surface is configured to angle away from a vertical plane of a building at an angle of between 5 and 40 degrees. The first surface has a length that is greater than a length of the second surface.

According to certain example embodiments, there may be provided an array that includes a plurality of the components described in the preceding paragraph.

In certain example embodiments, there is provided a photovoltaic system adapted for integration into and/or connection onto a building. At least one photovoltaic module is adapted to be disposed along at least a portion of a side of the building. A glass substrate has a first major surface adjacent to the at least one photovoltaic module. The glass substrate is patterned opposite the first major surface so as to form a plurality of modules, each said module including first and second edge portions, with the first edge portion being angled away from the at least one photovoltaic module and with the second edge portion being angled towards the at least one photovoltaic module such that the first and second edge portions, together with the first major surface, are substantially triangularly shaped when viewed in cross section.

In certain example embodiments, a method of making an asymmetric component for a building integrated photovoltaic (BIPV) or a building adapted photovoltaic (BAPV) system is provided. At least a portion of a glass substrate is shaped into an asymmetric patterned shape that includes a first surface, a second surface, and a third surface. The third surface is adapted to be laminated to a photovoltaic device. The first surface is shaped such that an acute angle between a plane that is parallel to the first surface and a vertical plane of a building is formed, with the acute angle being between 5 and 40 degrees. The first surface has a length that is greater than a length of the second surface. The asymmetric patterned shape is substantially triangular when viewed in cross section.

In certain example embodiments, a method of making a photovoltaic system for a building is provided. A plurality of components may be made in accordance the method of the previous paragraph. At least one photovoltaic module is oriented against at least a portion of at least some of the third surfaces.

The features, aspects, advantages, and example embodiments described herein may be combined in any suitable combination or sub-combination to realize yet further embodiments.

BRIEF DESCRIPTION OF THE DRAWINGS

These and other features and advantages may be better and more completely understood by reference to the following detailed description of exemplary illustrative embodiments in conjunction with the drawings, of which.

DETAILED DESCRIPTION OF EXAMPLE EMBODIMENTS OF THE INVENTION

The following description is provided in relation to several example embodiments which may share common characteristics, features, etc. It is to be understood that one or more features of any one embodiment may be combinable with one or more features of other embodiments. In addition, single features or a combination of features may constitute an additional embodiment(s), e.g., in any suitable combination or sub-combination.

Certain example embodiments herein relate to building-integrated photovoltaic (BIPV) systems, products, etc and methods of making the same. Certain example embodiments herein relate to building-applied photovoltaic (BAPV) systems, products, etc., and/or methods of making the same.

Figure 1:
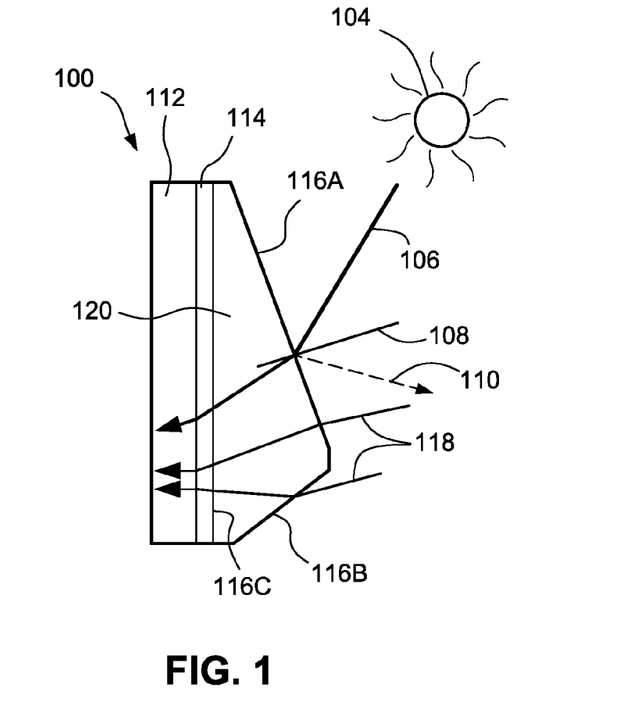
FIG. 1 is a cross-sectional view of an example PV element according to certain example embodiments.

Referring now more particularly to the accompanying drawings in which like reference numerals indicate like parts throughout the several views, FIG. 1 is a cross-sectional view of an example PV element according to certain example embodiments. A PV element 100 includes a semiconductor layer 112 that is laminated to a glass substrate 120 with a laminate 114. The laminate may be a polymer inclusive adhesive of a material such as ethyl vinyl acetate (EVA), polyvinyl butyral (PVB), or the like.

The glass substrate may have a front surface 116A that is angled. This angling may reduce the amount of direct sun light 106 that is reflected 110 from the surface 116A, even as the sun 104 moves across the sky. The surface 116A may have a normal vector 108 that is not perpendicular to the vertical plane of the building upon which the PV element 100 may be installed. The normal vector 108 may be angled in the direct that the direct sunlight approaches. The reduction in direct sunlight being reflected may facilitate an increase "coupling-in" of the direct component of light hitting the surface 116A of the glass substrate 120.

The glass substrate 120 may also include a bottom surface 116E and a surface 116C that is laminated to the semiconductor layer 112 (e.g., a PV sub-assembly). Alternatively, or in addition to the direct light 106, diffuse light 118 may be coupled-in through the surfaces 116A and 116B of the glass substrate 120.

In certain example embodiments, the surface 116C may be between about 0.2 mm and 100 mm, or more preferably between about 0.3 mm and 50 mm in length. In certain example embodiments, the ratio of length of the surface 116A to the length of surface 116B may be between a ratio of 1.25 and 3.5 to 1, more preferably between about 1.5 or 1.6 and 3 to 1, and even more preferably about 2.5 to 1.

Figure 2:
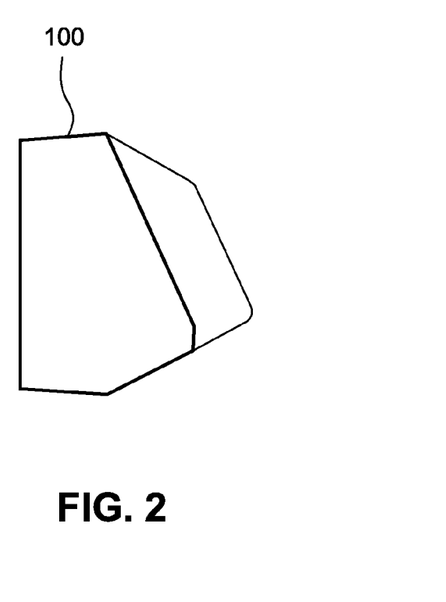
FIG. 2 is a perspective view the example PV element of FIG. 1.

In certain example embodiments, an angle formed between surface 116A and surface 116C may be between about 15 and 35 degrees. It will be appreciated, that the angle of the surface 116A may be adjusted depending on the particular needs of a given application. For example, a building that is located closer to the equator may have an increased angle (e.g., 32 degrees for example) to account for the sun being generally higher in the sky. Conversely, a building that is located at a higher latitude along the surface of the Earth may have a reduced angle for the surface 116A, for example between 15 to 25 degrees. Accordingly, based on the needs, position, etc., of a building, a PV element may be designed and implemented to increase the efficiency of the installed PV element according to certain example embodiments. FIG. 2 is a perspective view of the PV element shown in FIG. 1 according to certain example embodiments. As shown in FIGS. 1 and 2, a surface transition region may be provided between a bottommost portion of surface 116A and an uppermost portion of surface 116B in certain example embodiments.

Figure 3:
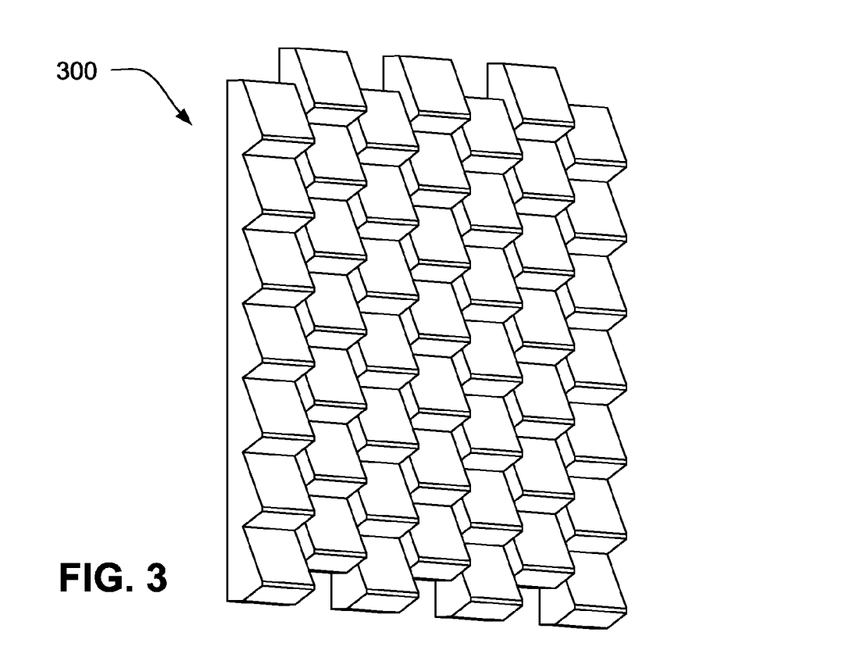
FIG. 3 is a perspective view of a two dimensional PV system including multiple PV elements according to certain example embodiments.
Figure 4:
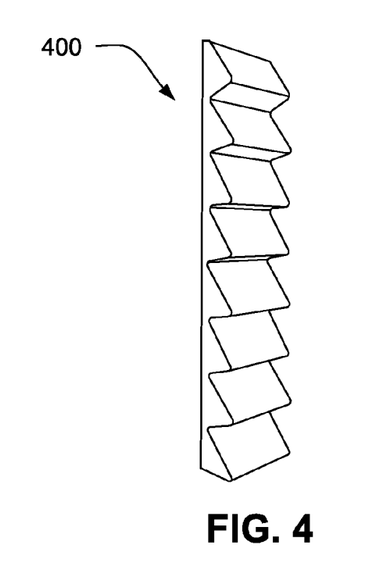
FIG. 4 is a perspective view of one dimensional PV system that includes multiple PV elements according to certain example embodiments.

FIGS. 3 and 4 show perspective views of PV systems according to certain example embodiments. In certain instances, a two dimensional array of patterned PV elements may be combined to form a larger patterned PV system 300. It will be appreciated that while the array in FIG. 3 is shown with offsetting sequences of individual PV elements, that the PV elements may be aligned across the surface of the PV array 300. FIG. 4, by contrast, does not have offset portions. In certain example embodiments, the angle the front surface (e.g., surface 116A) of the PV elements may be variable from top-to-bottom and/or from left-to-right. Thus, in certain example embodiments, at the bottom of a PV array the PV elements may have an increased angle, while further "up" the PV array the PV elements have a reduced angle for the front surface. Alternatively, the angle of the multiple angled surfaces may be substantially the same or the same (e.g., within a manufacturing margin of error).

Figure 5:
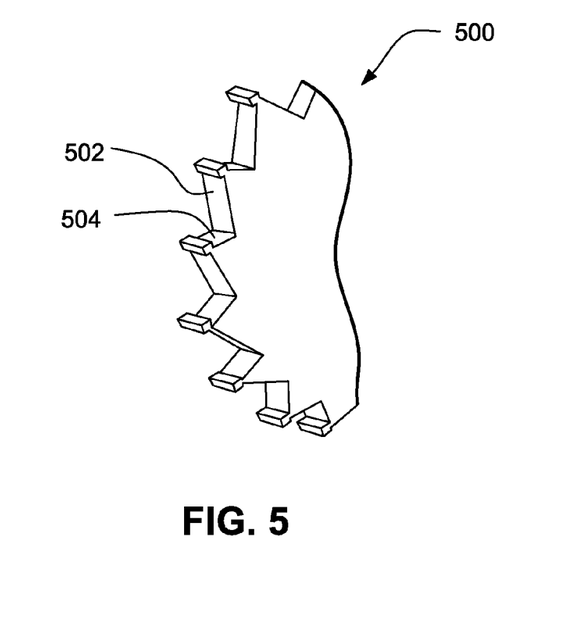
FIG. 5 is a perspective view of a roller used for forming a glass substrate according to certain example embodiments.

FIG. 5 is a perspective view of a roller that may be used for forming a glass substrate according to certain example embodiments. Glass substrates that are laminated to a PV subassembly may be formed by patterning through the use of roller 500. The roller 500 may include a series of "teeth" that have at least two exposed surfaces 502 and 504. A substrate, for example a glass substrate, may be fed into the roller 500 (e.g., via a conveyer or other means). As the glass substrate moves beneath the roller, the teeth may form indentations in the surface of glass substrate to thereby create a predetermined pattern. Surface 502 may form front surface 116A shown in FIG. 1 and surface 504 may form back surface 116B in FIG. 1. As the glass substrate is continually provided to the roller 500, the roller 500 may turn and thereby form a successive pattern of indentations within the provided glass substrate. It will be appreciated that multiple of such rollers may be provided in offset positions so as to create corresponding offset patterns, e.g., as shown in FIG. 3.

In different example embodiments, the production of a pattern in a glass substrate may be accomplished on a patterning line either at the cold end of the float line or after glass reheating using exemplary rollers described herein.

In certain example embodiments, a single sequence of patterns may be introduced in a substrate similar to the indentations (e.g., as shown in FIG. 4). As alluded to above, in certain example embodiments, multiple rollers may be combined such that an array of patterns is formed into a glass substrate (e.g., as is shown in FIG. 3). When rollers are combined, they may be offset so as to produce the offset pattern shown in FIG. 3 or may be aligned to produce the more in-line pattern of FIG. 4.

In certain example embodiments, the glass substrate of a PV element may be form via heat bending or forming. Devices and methods for heat bending glass sheets are well known in the art. See, for example, see U.S. Pat. Nos. 5,383,990; 6,240,746; 6,321,570; 6,318,125; 6,158,247; 6,009,726; 4,364,766; 5,443,669; 7,140,204; 6,983,104; and 7,082,260, of which the entire contents of each are hereby incorporated by reference.

As noted herein, an asymmetric substrate may be made out of glass. In certain example embodiments, the glass substrate may be a high transmission type of glass. One technique of producing high transmission glass is by producing low iron glass. See, for example, U.S. Pat. Nos. 7,700,870; 7,557,053; and 5,030,594, and U.S. Publication Nos. 2006/0169316; 2006/0249199; 2007/0215205; 2009/0223252; 2010/0122728; 2009/0217978; 2010/0255980, the entire contents of each of which are hereby incorporated by reference.

An exemplary soda-lime-silica base glass according to certain embodiments of this invention, on a weight percentage basis, includes the following basic ingredients:

TABLE 1

Example Base Glass

| Ingredient | Weight % |
|---|---|
| SiO$_2$ | 67-75% |
| Na$_2$O | 10-20% |
| CaO | 5-15% |
| MgO | 0-7% |
| Al$_2$O$_3$ | 0-5% |
| K$_2$O | 0-5% |

Other minor ingredients, including various conventional refining aids, such as SO$_3$, carbon, and the like may also be included in the base glass. In certain embodiments, for example, glass herein may be made from batch raw materials silica sand, soda ash, dolomite, limestone, with the use of sulfate salts such as salt cake (Na$_2$SO$_4$) and/or Epsom salt (MgSO$_4$×7H$_2$O) and/or gypsum (e.g., about a 1:1 combination of any) as refining agents. In certain example embodiments, soda-lime-silica based glasses herein include by weight from about 10-15% Na$_2$O and from about 6-12% CaO.

In addition to the base glass (e.g., see Table 1 above), in making glass according to certain example embodiments of the instant invention the glass batch includes materials (including colorants and/or oxidizers) which cause the resulting glass to be fairly neutral in color (slightly yellow in certain example embodiments, indicated by a positive b* value) and/or have a high visible light transmission. These materials may either be present in the raw materials (e.g., small amounts of iron), or may be added to the base glass materials in the batch (e.g., antimony and/or the like). In certain example embodiments of this invention, the resulting glass has visible transmission of at least 75%, more preferably at least 80%, even more preferably of at least 85%, and most preferably of at least about 90% (sometimes at least 91%) (Lt D65).

In certain embodiments of this invention, in addition to the base glass, the glass and/or glass batch comprises or consists essentially of materials as set forth in Table 2 below (in terms of weight percentage of the total glass composition):

TABLE 2

Example Additional Materials In Glass

| Ingredient | General (Wt. %) | More Preferred | Most Preferred |
|---|---|---|---|
| Total Iron (expressed as Fe$_2$O$_3$) | 0.001-0.06% | 0.005-0.045% | 0.01-0.03% |
| Percentage of FeO | 0-0.0040% | 0-0.0030% | 0.001-0.0025% |
| glass redox (FeO/total iron) | <=0.10 | <=0.06 | <=0.04 |
| cerium oxide | 0-0.07% | 0-0.04% | 0-0.02% |
| antimony oxide | 0.01-1.0% | 0.01-0.5% | 0.1-0.3% |
| SO$_3$ | 0.1-1.0% | 0.2-0.6% | 0.25-0.5% |
| TiO$_2$ | 0-1.0% | 0.005-0.4% | 0.01-0.04% |

In certain example embodiments, the antimony may be added to the glass batch in the form of one or more of Sb$_2$O$_3$ and/or NaSbO$_3$. Note also Sb(Sb$_2$O$_5$). The use of the term antimony oxide herein means antimony in any possible oxidation state, and is not intended to be limiting to any particular stoichiometry.

The low glass redox evidences the highly oxidized nature of the glass. Due to the antimony (Sb), the glass is oxidized to a very low ferrous content (% FeO) by combinational oxidation with antimony in the form of antimony trioxide (Sb$_2$O$_3$), sodium antimonite (NaSbO$_3$), sodium pyroantimonate (Sb(Sb$_2$O$_5$)), sodium or potassium nitrate and/or sodium sulfate. In certain example embodiments, the composition of the glass substrate 1 includes at least twice as much antimony oxide as total iron oxide, by weight, more preferably at least about three times as much, and most preferably at least about four times as much antimony oxide as total iron oxide.

In certain example embodiments of this invention, the colorant portion is substantially free of other colorants (other than potentially trace amounts). However, it should be appreciated that amounts of other materials (e.g., refining aids, melting aids, colorants and/or impurities) may be present in the glass in certain other embodiments of this invention without taking away from the purpose(s) and/or goal(s) of the instant invention. For instance, in certain example embodiments of this invention, the glass composition is substantially free of, or free of, one, two, three, four or all of: erbium oxide, nickel oxide, cobalt oxide, neodymium oxide, chromium oxide, and selenium. The phrase "substantially free" in this context means no more than 2 ppm and possibly as low as 0 ppm of the element or material.

The total amount of iron present in the glass batch and in the resulting glass, i.e., in the colorant portion thereof, is expressed herein in terms of $Fe_2O_3$ in accordance with standard practice. This, however, does not imply that all iron is actually in the form of $Fe_2O_3$ (see discussion above in this regard). Likewise, the amount of iron in the ferrous state ($Fe^{2+}$) is reported herein as FeO, even though all ferrous state iron in the glass batch or glass may not be in the form of FeO. As mentioned above, iron in the ferrous state ($Fe^{2+}$; FeO) is a blue-green colorant, while iron in the ferric state ($Fe^{3+}$) is a yellow-green colorant; and the blue-green colorant of ferrous iron is of particular concern, since as a strong colorant it introduces significant color into the glass which can sometimes be undesirable when seeking to achieve a neutral or clear color.

In view of the above, glasses according to certain example embodiments of this invention achieve a neutral or substantially clear color and/or high visible transmission. In certain embodiments, resulting glasses according to certain example embodiments of this invention may be characterized by one or more of the following transmissive optical or color characteristics when measured at a thickness of from about 1-6 mm (most preferably a thickness of about 3-4 mm; this is a non-limiting thickness used for purposes of reference only) (Lta is visible transmission %). It is noted that in the table below the a* and b* color values are determined per Ill. D65, 10 degree Obs.

TABLE 3

Glass Characteristics Of Example Embodiments

| Characteristic | General | More Preferred | Most Preferred |
|---|---|---|---|
| Lta (Lt D65): | >=85% | >=90% | >=91% |
| % τe (ISO 9050): | >=85% | >=90% | >=91% |
| % FeO (wt. %): | <=0.004% | =0.003% | <=0.0020% |
| L* (Ill. D65, 10 deg.): | 90-99 | n/a | n/a |
| a* (Ill. D65, 10 deg.): | −1.0 to +1.0 | −0.5 to +0.5 | −0.2 to 0.0 |
| b* (Ill. D65, 10 deg.): | 0 to +1.5 | +0.1 to +1.0 | +0.2 to +0.7 |

Accordingly, a patterned glass substrate may be produced out of low-iron and/or high transmission glass.

In certain example embodiments, the PV subassembly backing the patterned asymmetric glass substrate may be transparent, semi-transparent, translucent, or the like. This may allow the PV elements (or PV systems that include multiple PV elements) to function as windows on buildings.

Figure 6A:
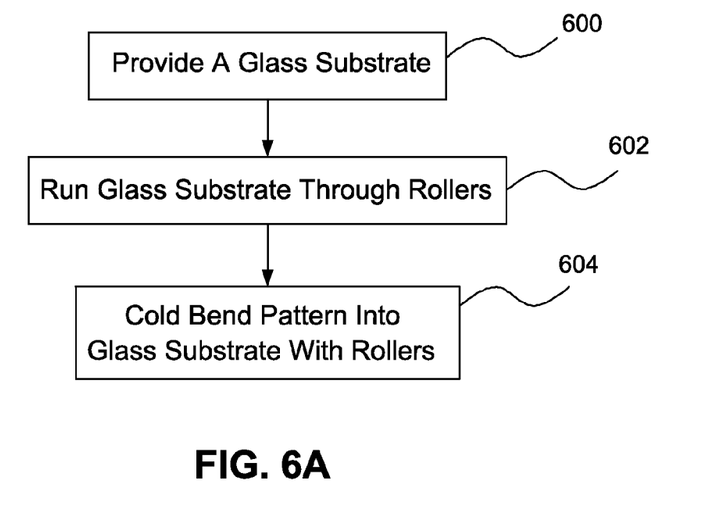
FIGS. 6A and 6B show example processes for creating glass substrates of example PV systems according to certain example embodiments.
Figure 6B:
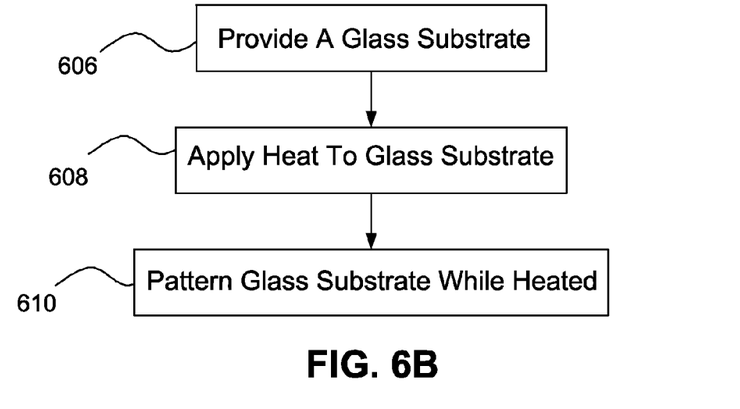

FIGS. 6A and 6B show example processes for creating glass substrates of example PV systems according to certain example embodiments. In FIG. 6A, for instance, in step 600 a glass substrate may be provided. For example, a glass substrate that has increased transmission values for light may be provided. In step 602, the provided glass substrate may be matched to the rollers described herein. In step 604, the rollers may facilitate the forming of the pattern in the provided glass substrate via bending techniques, such as, for example, cold bending.

As shown in FIG. 6B, for instance, in certain example embodiments, a glass substrate may be provided in step 606, and heat may be applied to the glass substrate in step 608. The applied heat may be a reheating of the glass substrate (e.g., after the glass substrate has been initially heated) in certain example instances. The glass may be patterned while the heat is applied to the substrate in step 610. In certain example embodiments, the forming of the pattern may be achieved with the rollers described herein.

Figure 6C:
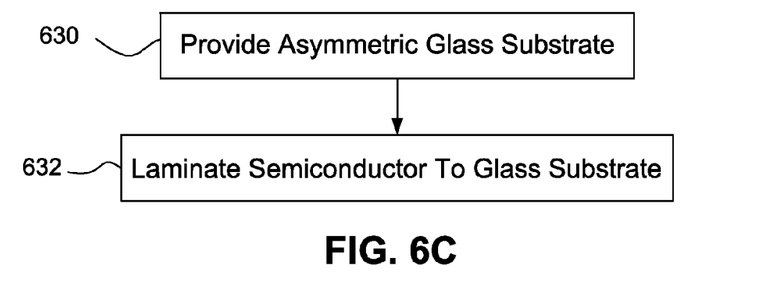
FIG. 6C shows a process of creating an example PV system according to certain example embodiments.

FIG. 6C shows a process for creating an example PV system according to certain example embodiments. An asymmetric glass substrate is provided in step 630. A semiconductor element, PV subassembly, or PV array may be laminated to the back of the asymmetric glass substrate in step 632.

In certain example embodiments, an anti-reflective coating may be applied to the glass substrate that is used in conjunction with a PV system. The antireflective coating may be provided to the first surfaces if it is sufficient durable. In other example embodiments, the anti-reflective coating may be interposed between the substrate and the semiconductor layers. The AR coatings may be sputter deposited in certain example embodiments. Sputter deposited heat treatable AR coatings are disclosed in, for example, U.S. Publication No. 2011/0157703, as well as U.S. application Ser. Nos. 12/923,838, filed on Oct. 8, 2010 and 12/929,481, filed on Jan. 27, 2011, the entire contents of each of which are hereby incorporated by reference herein.

An example four-layer heat treatable sputter deposited AR coating may include, for example, an index matching and/or stress reducing layer, a medium index layer, a high index layer, and a low index layer, in that order, moving away from the substrate. In certain example embodiments, the index matching and/or stress reducing layer may comprise silicon oxide or silicon oxynitride, the medium index layer may comprise silicon oxynitride, the high index layer may comprise niobium oxide and/or titanium oxide, and the low index layer may comprise silicon oxide.

The index matching and/or stress reducing layer may substantially match the index of refraction of the supporting glass substrate. By "substantially matches," in this context it is meant that the refractive index of the layer is within about 0.2 of the refractive index of the glass substrate, more preferably within about 0.1, and most preferably the difference is no greater than about 0.05 or 0.04. This index matching and/or stress reducing layer may have a thickness of from about 50 to 300 nm, more preferably from about 60 to 120 nm, and most preferably from about 60 to 100 nm. However, a layer having any thickness sufficient to turn the net stress of the coating into compressive stress without significantly degrading the optical and/or physical characteristics of coating may be used in other example embodiments. The inclusion of an additional index-matching/stress-reducing layer may be advantageous because a coating including an additional layer with a higher magnitude of compressive stress has been found to have a lower overall net stress.

The medium index layer may have a thickness of from about 30 to 150 nm, more preferably from about 40 to 80 nm, and most preferably from about 50 to 70 nm, with an exemplary thickness range being from about 53-65 nm. The medium index layer may have a refractive index from about 1.6 to 2.0, more preferably from about 1.65 to 1.95, and most preferably from about 1.7 to 1.8 or 1.9.

The high index layer may have a refractive index of from about 2.0 to 2.6, more preferably from about 2.1 to 2.5, and most preferably from about 2.2 to 2.4. The high index layer may have a thickness of from about 50 to 150 nm, more preferably from about 75 to 125 nm, even more preferably from about 80 to 120 nm, and most preferably from about 85 to 105 nm. In other example embodiments, however, this high index layer may be thinned in order to reduce the net tensile stress of the AR coating, e.g., such that it has a thickness of less than about 50 nm, or even less than about 25 nm in some instances. In further example embodiments, the high index layer may comprise a high index material having a lesser tensile stress value, before and/or after heat treatment. In this regard, it may comprise an oxide of niobium in some instances. In other instances, it may comprise an oxide of titanium. In further example embodiments, it may comprise another suitable, high index material.

The low index layer will have an index of refraction lower than that of the medium and high index layers, and may even have an index of refraction lower than that of the index matching and/or stress reducing layer. In certain examples, the refractive index of the low index layer may be from about 1.3 to 1.6, more preferably from about 1.35 to 1.55, and most preferably from about 1.43 to 1.52. Its thickness may be from about 40 to 200 nm, more preferably from about 50 to 110 nm, and most preferably from about 60 to 100 nm, with an example thickness being around 80 nm.

In certain example embodiments, the index matching and/or stress reducing layer and the low index layer may have substantially the same thicknesses. For example, their thicknesses may differ by no more than about 15 nm, more preferably no more than about 10 nm, and most preferably no more than about 5 nm, according to certain example embodiments.

Although certain example embodiments have been described in relation to sputtered AR coatings, other techniques may be used in different embodiments. For example, PE-CVD deposited AR coatings may be used in certain scenarios, as may wet-applied AR coatings (e.g., in connection with a sol gel type process).

In certain example embodiments, there is provided a component adapted for use with a building integrated photovoltaic (BIPV) or a building adapted photovoltaic (BAPV) system. An asymmetric glass substrate includes first, second, and third surfaces when viewed in cross section, with the asymmetric glass substrate being substantially triangular shaped in cross section such that the third surface is longer than the first and second surfaces. The third surface is adapted to be laminated to a photovoltaic device. The first surface is configured to angle away from a vertical plane of a building at an angle of between 5 and 40 degrees. The first surface has a length that is greater than a length of the second surface.

In certain example embodiments, in addition to the features of previous paragraph, the third surface may have a length of between about 0.3 mm and 50 mm.

In certain example embodiments, in addition to the features of either of the two previous paragraphs, a ratio of the length of the first surface to the length of the second surface may be between about 1.5 and 3 to 1.

In certain example embodiments, in addition to the features of any one of the previous three paragraphs, the ratio may be about 2.5 to 1.

In certain example embodiments, in addition to the features of any one of the previous four paragraphs, a photovoltaic sub-assembly may be laminated to at least a portion of the third surface.

In certain example embodiments, there may be provided an array that includes a plurality of the components of any one of the previous five paragraphs.

In certain example embodiments, in addition to the features of previous paragraph, the array may be a two dimensional array.

In certain example embodiments, in addition to the features of either of the previous two paragraphs, the first surfaces of the plurality of components may be parallel with each other.

In certain example embodiments, in addition to the features of any one of the previous three paragraphs, at least one photovoltaic sub-assembly may be laminated to at least a portion of each one of third surfaces of the plurality of components.

In certain example embodiments, in addition to the features of previous paragraph, the first surfaces of the plurality of components may be staggered relative to one another, except when they are provided in parallel to one another.

In some cases, some "rows" may include staggered modules whereas others may include parallel modules.

In certain example embodiments, in addition to the features of any one of the previous five paragraphs, the first surfaces of the plurality of components may vary in length when moving from top to bottom of the array.

in certain example embodiments, there is provided a photovoltaic system adapted for integration into and/or connection onto a building. At least one photovoltaic module is adapted to be disposed along at least a portion of a side of the building. A glass substrate has a first major surface adjacent to the at least one photovoltaic module. The glass substrate is patterned opposite the first major surface so as to form a plurality of modules, each said module including first and second edge portions, with the first edge portion being angled away from the at least one photovoltaic module and with the second edge portion being angled towards the at least one photovoltaic module such that the first and second edge portions, together with the first major surface, are substantially triangularly shaped when viewed in cross section.

In certain example embodiments, in addition to the features of previous paragraph, the modules may be horizontally staggered relative to one another.

In certain example embodiments, in addition to the features of either of the two previous paragraphs, a ratio of the length of the first edge portion to the length of the second edge portion may be between about 1.5 and 3 to 1.

In certain example embodiments, in addition to the features of any one of the previous three paragraphs, a plurality of photovoltaic modules may be connected in series.

In certain example embodiments, a method of making an asymmetric component for a building integrated photovoltaic (BIPV) or a building adapted photovoltaic (BAPV) system is provided. At least a portion of a glass substrate is shaped into an asymmetric patterned shape that includes a first surface, a second surface, and a third surface. The third surface is adapted to be laminated to a photovoltaic device. The first surface is shaped such that an acute angle between a plane that is parallel to the first surface and a vertical plane of a building is formed, with the acute angle being between 5 and 40 degrees. The first surface has a length that is greater than a length of the second surface. The asymmetric patterned shape is substantially triangular when viewed in cross section.

In certain example embodiments, in addition to the features of previous paragraph, the third surface may have a length of between about 0.3 mm and 50 mm.

In certain example embodiments, in addition to the features of either of the two previous paragraphs, a ratio of the length of the first surface to the length of the second surface may be between about 1.5 and 3 to 1.

In certain example embodiments, in addition to the features of the paragraph, the ratio may be about 2.5 to 1.

In certain example embodiments, in addition to the features of any one of the previous four paragraphs, a photovoltaic sub-assembly may be laminated to at least a portion of the third surface.

In certain example embodiments, in addition to the features of any one of the previous five paragraphs, the shaping may include patterning the glass substrate via at least one roller, with the at least one roller including a plurality of major and minor surfaces that respectively bend or shape the glass substrate to form the first and second surfaces on the glass substrate.

In certain example embodiments, in addition to the features of any one of the previous six paragraphs, the shaping may include shaping a plurality asymmetric patterned shapes into the glass substrate, with each one of the plurality including respective first, second, and third surfaces.

In certain example embodiments, in addition to the features of any one of the previous seven paragraphs, the shaping may be performed after the glass is cooled and then re-heated.

In certain example embodiments, a method of making a photovoltaic system for a building is provided. A plurality of components may be made in accordance the method in any of the previous eight paragraphs. At least one photovoltaic module is oriented against at least a portion of at least some of the third surfaces.

In certain example embodiments, in addition to the features of previous paragraph, the components may be staggered relative to one another.

The patterned glass substrates may be heat treated (e.g., thermally tempered or heat strengthened) in certain example embodiments. Tempering typically requires use of temperature(s) of at least about 580 degrees C., more preferably of at least about 600 degrees C. and still more preferably of at least 620 degrees C. The terms "heat treatment" and "heat treating" as used herein mean heating the article to a temperature sufficient to achieve thermal tempering and/or heat strengthening of the glass inclusive article. This definition includes, for example, heating a coated article in an oven or furnace at a temperature of at least about 550 degrees C., more preferably at least about 580 degrees C., more preferably at least about 600 degrees C., more preferably at least about 620 degrees C., and most preferably at least about 650 degrees C. for a sufficient period to allow tempering and/or heat strengthening. This may be for at least about two minutes, or up to about 10 minutes, in certain example embodiments.

As used herein, the terms "on," "supported by," and the like should not be interpreted to mean that two elements are directly adjacent to one another unless explicitly stated. In other words, a first layer may be said to be "on" or "supported by" a second layer, even if there are one or more layers there between.

While the invention has been described in connection with what is presently considered to be the most practical and preferred embodiment(s), it is to be understood that the invention is not to be limited to the disclosed embodiment, but on the contrary, is intended to cover various modifications and equivalent arrangements included within the spirit and scope of the claims.

What is claimed is:

1. An array of components adapted for use with a building integrated photovoltaic (BIPV) or a building adapted photovoltaic (BAPV) system, the array of components comprising:
    each component comprising an asymmetric glass substrate including first, second, and third surfaces when viewed in cross section, the asymmetric glass substrate including a plurality of sections each having the first, second and third surfaces and each of which is substantially triangular shaped in cross section such that the third surface is longer than the first and second surfaces and wherein each of the sections includes an apex at the top of the substantially triangular cross section so that each of the components includes a plurality of apices, wherein: the third surface is adapted to be laminated to a photovoltaic device, the first surface is configured to angle away from a vertical plane of a building at an angle of between 5 and 40 degrees, and the first surface has a length that is greater than a length of the second surface;
    wherein first and second of the components are located parallel to and adjacent to each other but offset relative to one another, so that the apices of the first component are offset from and not linearly aligned with the apices of the second component.

2. The array of components of claim 1, wherein the third surface has a length of between 0.3 mm and 50 mm.

3. The array of components of claim 1, wherein a ratio of the length of the first surface to the length of the second surface is between 1.5 and 3 to 1.

4. The array of components of claim 3, wherein the ratio is from 2.5 to 1.

5. The array of components of claim 1, further comprising a photovoltaic sub-assembly that is laminated to at least a portion of the third surface.

6. The array of claim 1, wherein the array is a two dimensional array.

7. The array of claim 1, further comprising at least one photovoltaic sub-assembly that is laminated to at least a portion of the third surfaces of the plurality of components.

8. The array of claim 1, wherein the first surfaces of the plurality of components vary in length when moving from top to bottom of the array.

9. A photovoltaic system adapted for integration into and/or connection onto a building, comprising:
    at least one photovoltaic module adapted to be disposed along at least a portion of a side of the building; and
    a plurality of glass substrates each having a first major surface adjacent to the at least one photovoltaic module, wherein each of the glass substrates is patterned opposite the first major surface so as to form a plurality of modules, each said module including first and second edge portions, the first and second edge portions being angled away from the at least first major surface such that the first and second edge portions, together with the first major surface, are substantially triangularly shaped when viewed in cross section, and
    wherein first and second of the glass substrates are located parallel to and adjacent to each other, but offset relative to one another, so that apices of the substantially triangular shaped cross sections of the first substrate are offset from and not linearly aligned with the apices of the substantially triangular shaped cross sections of the second substrate.

10. The photovoltaic system of claim 9, wherein the modules are horizontally staggered relative to one another.

11. The photovoltaic system of claim 9, wherein a ratio of the length of the first edge portion to the length of the second edge portion is between 1.5 and 3 to 1.

12. The photovoltaic system of claim 9, further comprising a plurality of photovoltaic modules connected in series.

* * * * *